United States Patent
Yang

(10) Patent No.: US 7,613,069 B2
(45) Date of Patent: Nov. 3, 2009

(54) ADDRESS LATCH CIRCUIT OF SEMICONDUCTOR MEMORY DEVICE

(75) Inventor: Sun Suk Yang, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 413 days.

(21) Appl. No.: 11/683,532

(22) Filed: Mar. 8, 2007

(65) Prior Publication Data

US 2007/0291576 A1 Dec. 20, 2007

(30) Foreign Application Priority Data

Jun. 19, 2006 (KR) .................... 10-2006-0054993

(51) Int. Cl.
*G11C 8/06* (2006.01)
(52) U.S. Cl. .............. 365/230.08; 365/233.1; 365/233.11; 365/233.12; 365/233.13
(58) Field of Classification Search ............ 365/230.08, 365/233.1, 233.11, 233.12, 233.13
See application file for complete search history.

(56) References Cited

U.S. PATENT DOCUMENTS

| | | | |
|---|---|---|---|
| 6,636,446 B2 * | 10/2003 | Lee et al. ................... | 365/194 |
| 7,085,192 B2 * | 8/2006 | Fujisawa et al. .......... | 365/189.15 |
| 2003/0026138 A1 * | 2/2003 | Lee et al. .................... | 365/194 |
| 2005/0122795 A1 * | 6/2005 | Fujisawa et al. ............ | 365/191 |
| 2006/0044925 A1 * | 3/2006 | Faue et al. ............. | 365/230.08 |
| 2006/0104150 A1 * | 5/2006 | Yoshida et al. .............. | 365/233 |

FOREIGN PATENT DOCUMENTS

| | | |
|---|---|---|
| JP | 11-203859 | 7/1999 |
| JP | 11-288590 | 10/1999 |
| KR | 1020000043183 | 7/2000 |
| KR | 1020020017305 | 3/2002 |

OTHER PUBLICATIONS

Notice of Patent Grant-Korean Intellectual Property Office, Jul. 23, 2007.

* cited by examiner

*Primary Examiner*—Hoai V Ho
*Assistant Examiner*—Jay Radke
(74) *Attorney, Agent, or Firm*—Ladas & Parry LLP

(57) ABSTRACT

An address latch circuit of a semiconductor memory device is provided. The address latch circuit includes a first address latch part, which latches a first address signal fed from outside according to a first address latch signal and outputs a second address signal. An address shift part shifts the second address signal according to a divided clock, which is divided from an external clock, and a write latency signal, and outputs a third address signal. A second address latch part latches the third address signal according to a second address latch signal and outputs a fourth address signal.

26 Claims, 8 Drawing Sheets

ADDRESS LATCH CIRCUIT OF SEMICONDUCTOR MEMORY DEVICE

CROSS-REFERENCE TO RELATED APPLICATIONS

The present application claims priority to Korean patent application number 10-2006-0054993 filed on Jun. 19, 2006, which is incorporated herein by reference in its entirety.

BACKGROUND OF THE INVENTION

The present invention relates generally to a semiconductor memory device. More particularly, the present invention relates to an address latch circuit of a semiconductor memory device.

In general, a semiconductor memory device serves to perform a basic operation to store and read data. Data input from outside is stored to a cell, which is a storage, in a form of electric signals (HIGH and LOW) by way of a data line. The stored data is read through the reverse path.

The semiconductor memory device is being constantly improved to increase the integration density and operation speed. To raise the operation speed, a synchronous memory device was suggested which operates in synchrony to an external clock given from the outside of the semiconductor memory device. The synchronous memory device uses a single data rate (SDR) scheme which inputs and outputs data in one clock cycle at a data pin in synchrony to a rising edge of the external clock.

By contrast, a double data rate (DDR) synchronous memory device inputs and outputs two data in one clock cycle. That is, two data are input and output at the respective data input and output pins in synchrony to a rising edge and a falling edge of the external clock. Accordingly, the DDR synchronous memory device can have twice the bandwidth of the SDR synchronous memory device.

The DDR synchronous memory devices can be classified to a DDR1 synchronous memory device and a DDR2 synchronous memory device. The DDR1 synchronous memory device performs a 2-bit prefetch at the input and the output, and the DDR2 synchronous memory device performs a 4-bit prefetch at the input and the output under the same condition as the DDR1 synchronous memory device. That is, the DDR1 or DDP2 synchronous memory device consecutively inputs and outputs 2 or 4 data bits synchronized to the clock through input and output ports.

The SDR and the DDR synchronous memory devices support a write latency operation which inputs data after a certain clock cycle after a write command is applied. For instance, when the write latency is 1, after the write command is applied, data is input after one clock cycle. When the write latency is 3, after the write command is applied, data is input after three clock cycles.

However, a conventional semiconductor memory device supporting the write latency operation has the fixed write latency value. When the write latency value is fixed, command bus efficiency of the system is subject to degradation. To overcome this shortcoming, development is underway for a semiconductor memory device that is able to vary write latency.

For instance, the write latency of the DDR2 synchronous memory device is adjustable using a CAS latency and an additive latency which are set by a mode register set at initialization. In detail, the write latency of the DDR2 synchronous memory device is defined as a value acquired by subtracting 1 from a read latency. The read latency is defined as a summation of the CAS latency and the additive latency. Accordingly, the time tRCD is adjustable up to the input time of the write command, to thus achieve command channel flexibility.

FIG. 1 is a block diagram of an address latch circuit 100 of a conventional semiconductor device, and FIG. 2 is an operation timing diagram for illustrating an operation of the address latch circuit of FIG. 1. Specifically, FIG. 2 depicts the operation when the write latency is 1 in the DDR synchronous memory device which operates in the 4-bit prefetch.

Referring now to FIGS. 1 and 2, a latch part 110 of the address latch circuit 100 of the conventional semiconductor memory device latches address signals ADA and ADAZ fed from an address buffer 10 with a command pulse CASP6 and outputs the latched address signal to a clock shift part 120. The clock shift part 120 shifts the latched address signal AT as much as to correspond to the write latency in synchrony to an internal clock CLKP output from a clock buffer 20 and then outputs the shifted address signal to a column address generator 130. The column address generator 130 generates and outputs a column address signal CAT by latching the shifted address signal WL_AT with the write command pulse CASPWT6. The generated column address signal CAT may be fed to a column decoder (not shown) for the decoding.

The generated column address signal CAT is shifted by three clocks based on the internal clock CLKP, compared to the latched address signal AT. This is because the external write command signal WT and the external address signal ADD are input in synchrony to the first rising edge of the external clock CLK from the chip set, whereas four data signals are sequentially input from the second rising edge (because the write latency is 1) of the external clock CLK after the external write command WT is input.

More specifically, all four data signals are input at the fourth rising edge and require about 2-clock time from the fourth rising edge of the external clock CLK for the sake of the delay through a data buffer (not shown) and the arrangement to be used in the semiconductor memory device. Accordingly, to normally process the data in the semiconductor memory device, the generated column address command pulse CASP6 and the latched address signal AT should be shifted up to the sixth rising edge of the external clock CLK.

In other words, the address latch circuit 100 of the conventional semiconductor memory device shifts the address signal AT latched to the rising edge of the column address command pulse CASP6, as much as to correspond to the write latency, and then generates the column address signal CAT by latching it to the rising edge of the write command pulse CASPWT6.

However, when an external clock CLK of short cycle is input, the address latch circuit of the conventional semiconductor memory device is not able to output the column address signal CAT at a required time point for the rapid operation. In detail, when the cycle of the external clock CLK is shortened, the timing of the pulse edge which shifts the address signal may not match and the pulse width, which is the time for logic-processing address signal, may not be ensured.

For instance, given the external clock CLK with 1 GHz frequency, the semiconductor memory device operates in synchrony to the internal clock CLKP having the high pulse width of 500 ps and the low pulse width of 500 ps. In doing so, if the time taken for the semiconductor memory device to shift and logic-process the address signal exceeds 500 ps, the address signal may not be shifted to an intended time point or the logic process of the address signal may be subject to the fail.

SUMMARY OF THE INVENTION

The shortcomings of the prior art are overcome by an address latch circuit which includes a first address latch part, which latches a first address signal fed from outside according to a first address latch signal and outputs a second address signal; an address shift part which shifts the second address signal according to a divided clock, which is divided from an external clock, and a write latency signal, and outputs a third address signal; and a second address latch part which latches the third address signal according to a second address latch signal and outputs a fourth address signal.

The first address latch signal may be a column address command pulse, which is latched by delaying an internal command signal generated by an external command signal.

The divided clock may include a first divided clock and a second divided clock by dividing the external clock, the divided clocks having opposite phases from each other.

The second address latch signal may be a signal containing information relating to whether a command signal fed from the outside is input at a rising edge of the first divided clock or at a rising edge of the second divided clock.

The first address signal may be a differential signal fed through an external address buffer.

The write latency signal may be determined by a CAS latency and an additive latency defined at an external mode register set.

The address shift part may include a switching signal generator which receives the divided clock and the write latency signal and generates a switching signal; and a delay "means" also considered herein to be any appropriate time delay circuit or delay devices, such as transmission gates, which are known as TG gates. The "delay means" transfers the second address signal according to a delay time or delay degree, determined by the switching signal and the write latency signal, and then outputs the third address signal.

The switching signal generator may include a switching pulse generator, which outputs a first switching pulse delayed from the divided clock and a second switching pulse phase-inverted from the divided clock; a flag generator which outputs a flag signal indicating whether an even number of the write latency signals are input; and a switching pulse selector which selectively outputs one of the first switching pulse and the second switching pulse according to the flag signal, and outputs a fourth switching pulse by inverting the phase of the third switching pulse. The switching signal may include the first switching pulse, the second switching pulse, the third switching pulse, and the fourth switching pulse.

The switching pulse generator may include a first switching pulse generator and a second switching pulse generator. The first switching pulse generator may include an even number of inverters which receive the divided clock and output the first switching pulse; and an odd number of inverters which receive the divided clock and output the second switching pulse by inversing the phase.

The flag generator may include a NOR gate which receives an odd number of at least one write latency signal; and an inverter which outputs the flag signal by inverting a phase of an output signal of the NOR gate.

The switching pulse selector may include a first switching pulse transmission gate which transfers the first switching pulse and outputs the third switching pulse when the flag signal is enabled; a second switching pulse transmission gate which transfers the second switching pulse and outputs the third switching pulse when the flag signal is disabled; and an inverter which outputs the fourth switching pulse by inverting a phase of the third switching pulse.

The write latency signal may include a write latency signal indicating one of natural numbers 1 through 10.

The delay means may include separate delayers which correspond to the respective write latency signals; and a common delayer which delays and outputs an output signal of the separate delayer.

A first separate delayer of the separate delayers, corresponding to the write latency signal of 1 may include a first delay gate which is switched according to the second switching pulse to delay and transfer the second address signal to the common delayer when the write latency signal of 1 is enabled.

A second separate delayer of the separate delayers, corresponding to the write latency signal of 2 may include a first additional delay gate which delays and outputs the second address signal according to the first switching pulse and the second switching pulse; and a second delay gate which is switched according to the first switching pulse to delay and transfer an output signal of the first additional delay gate to the common delayer when the write latency signal of 2 is enabled.

The delay means may include a first latch part which is located between the first additional delay gate and the second delay gate to latch and output the output signal of the first additional delay gate to the second delay gate.

A third separate delayer of the separate delayers, corresponding to the write latency signal of 3 may include a second additional delay gate which receives and delays an output signal of the first additional delay gate of the second separate delayer according to the first switching pulse and the second switching pulse, and outputs the delayed signal to the first delay gate; and a third delay gate which is switched according to the second switching pulse to delay and output an output signal of the second additional delay gate to the common delayer when the write latency signal of 3 is enabled.

The delay means may include a second latch part which is located between the second additional delay gate and the first delay gate to latch and output an output signal of the second additional delay gate to the first delay gate.

A separate delayer of the separate delayers, corresponding to an even write latency signal above 4 may include a third additional delay gate which receives an output signal of an additional delay gate of a separate delayer corresponding to an odd write latency signal which is smaller than the even write latency signal by 1, delays and outputs the received signal according to the first switching pulse and the second switching pulse; and a fourth delay gate which is switched according to the first switching pulse when the even write latency signal above 4 is enabled, delays and transfers an output signal of the third additional delay gate to the common delayer.

A separate delayer of the separate delayers, corresponding to an odd write latency signal above 5 may include a fourth additional delay gate which receive an output signal of an additional delay gate of a separate delayer corresponding to an even write latency signal which is smaller than the odd write latency signal by 1, delays and outputs the received signal according to the first switching pulse and the second switching pulse; and a fifth delay gate which is switched according to the second switching pulse when the odd write latency signal above 5 is enabled, delays and transfers an output signal of the fourth additional delay gate to the common delayer.

The common delayer may include a transmission gate which delays an output signal of the separate delayer according to the third switching pulse and the fourth switching pulse, and outputs a third address signal.

The delay means may further include a third latch part which is located between the separate delayer and the common delayer to latch and output an output signal of the separate delayer to the common delayer.

The delay means may further include a fourth latch part which latches and outputs an output signal of the common delayer.

The address shift part may include a first address shift part which receives the first divided clock, shifts the second address signal according to the write latency, and outputs a third address signal; and a second address shift part which receives the second divided clock, shifts the second address signal according to the write latency, and outputs the third address signal.

The second address latch signal may include a first write command signal which is enabled when a command signal fed from outside is input at an rising edge of the first divided clock; and a second write command signal which is enabled when a command signal fed from outside is input at a rising edge of the second divided clock.

The second address latch part may receive output signals from the first address shift part and the second address shift part, and selectively output the third address signal, which is latched according to an enabled write command pulse of the first write command pulse and the second write command pulse, as a fourth address signal.

DESCRIPTION OF SPECIFIC EMBODIMENTS

Practical and presently preferred embodiments of the present invention are illustrative as shown in the following examples.

However, it will be appreciated that those skilled in the art, on consideration of this disclosure, may make modifications and improvements within the spirit and scope of the present invention.

Figure 1:
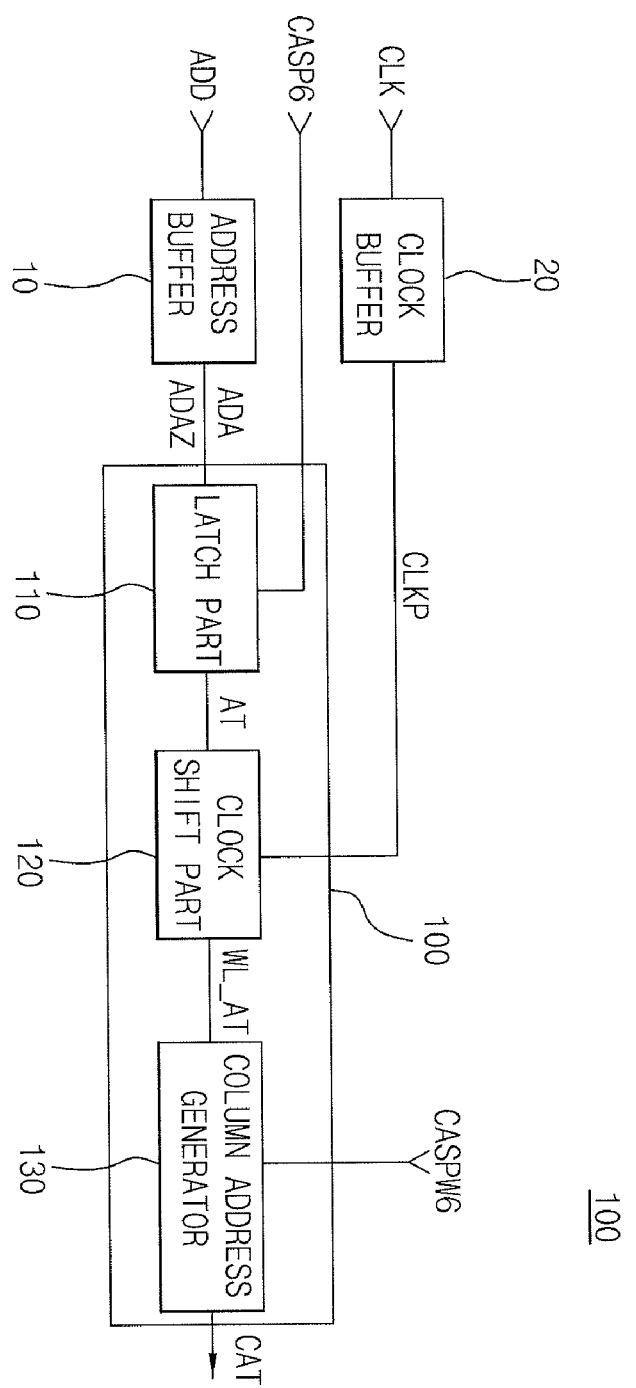
FIG. 1 is a block diagram of an address latch circuit of a conventional semiconductor memory device.
Figure 2:
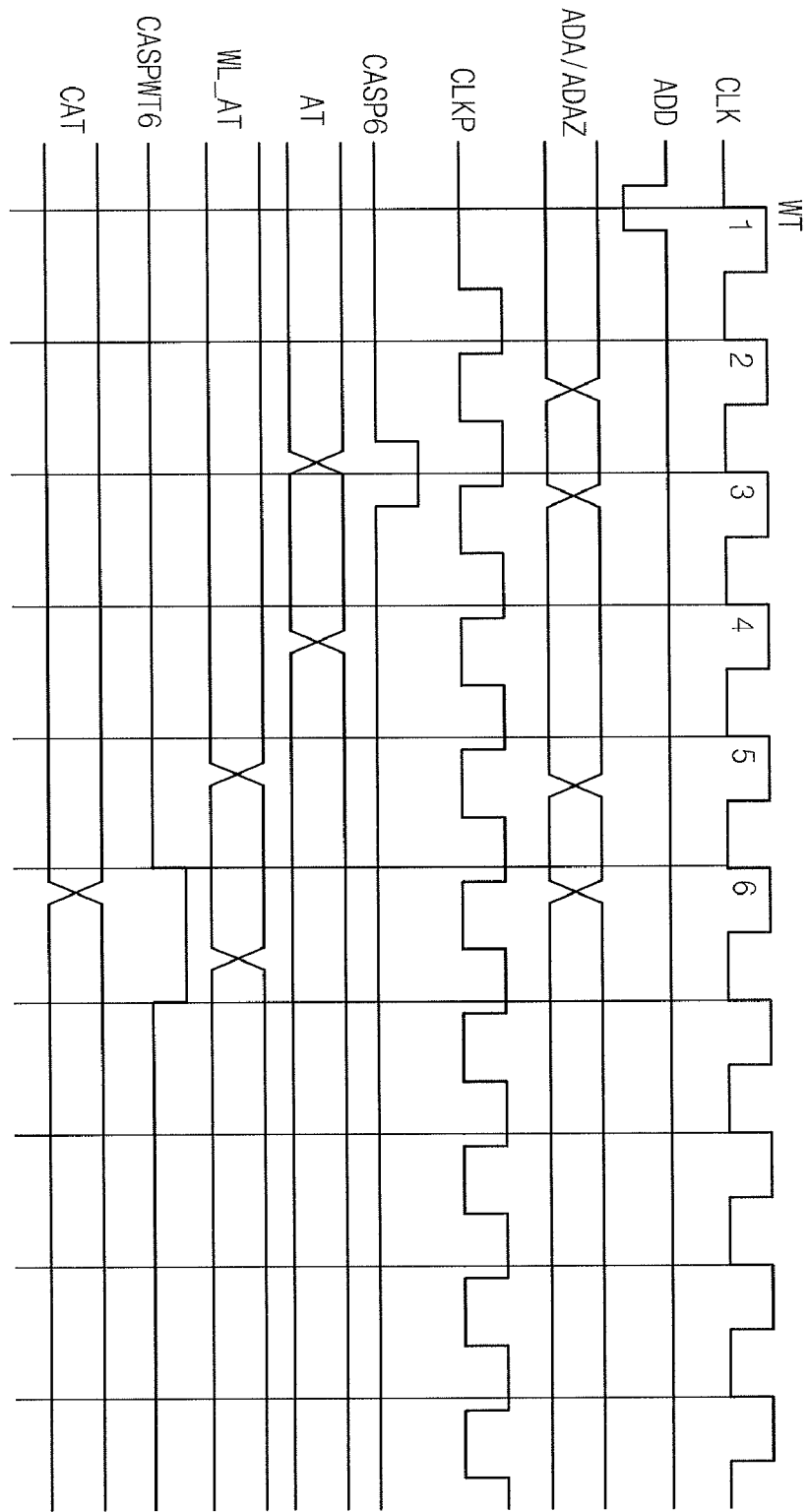
FIG. 2 is an operation timing diagram for illustrating an operation of the address latch circuit of FIG. 1.
Figure 3:
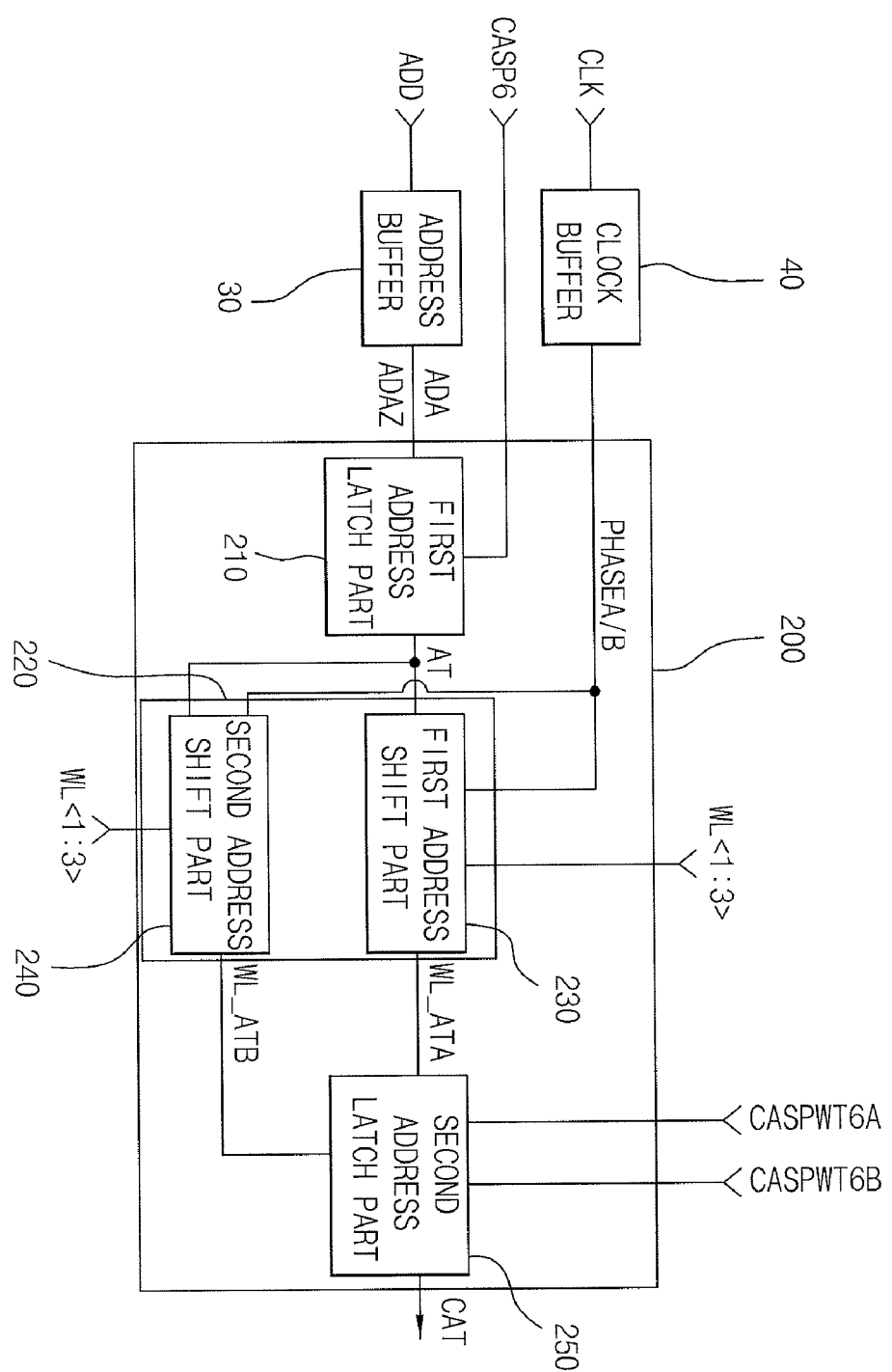
FIG. 3 is a block diagram of an address latch circuit according to an embodiment of the present invention.

FIG. 3 is a block diagram of an address latch circuit 20 according to an embodiment of the present invention. As shown in FIG. 3, the address latch circuit 200 includes a first address latch part 210, an address shift part 220, and a second address latch part 250.

The first address latch part 210 outputs a second address signal AT by latching first address signals ADA and ASAZ fed from outside the device, by a column address command pulse CASP6. Herein, the column address command pulse CASP6 is the latched signal by delaying an internal command signal generated by an external command signal.

Divided clocks PHASEA and PHASEB include a first divided clock PHASEA and a second divided clock PHASEB, which have phases that are opposite to each other, by dividing an external clock CLK. The divided clocks PHASEA and PHASEB are generated by a clock buffer 40 which receives the external clock CLK. According to an embodiment of the present invention, the divided clocks PHASEA and PHASEB are fed to the address shift part 220 and used as a switching signal to switch a delay means when shifting the second address signal AT.

The clock buffer 40 can include two D flip-flops (not shown), which receive the external clock CLK at clock ports. For instance, the clock buffer 40 can be configured by connecting a reverse output port of a first D flip-flop to a data port of the first D flip-flop and connecting an output port of the first D flip-flop to a data port of a second D flip-flop. In doing so, the output of the first D flip-flop becomes the divided clock PHASEA and the output of the second D flip-flop becomes the divided clock PHASEB.

Preferably, the first address signals ADA and ADAZ are differential signals input through an external address buffer 30. The address buffer 30 converts an address signal ADD input from a chip set (not shown) to differential address signals ADA and ADAZ of CMOS level available in the semiconductor memory device, and then applies the converted differential address signals ADA and ADAZ to the first address latch part 210.

The address buffer 30 can include an even number of inverters (not shown) which generate the address signal ADA from the address signal ADD fed from the chip set, and an odd number of inverters (not shown) which generates the address signal ADAZ from the address signal ADD fed from the chip set.

The address shift part 220 shifts the divided clocks PHASEA and PHASEB, which are divided from the external clock CLK, and the second address signal AT according to the write latency signal WL<1:3> and outputs third address signals WL_ATA and WL_ATB. Herein, the write latency signal WL<1:3> can be determined by CAS latency and additive latency that are defined at an external mode register set.

For instance, in the DDR2 synchronous semiconductor memory device, the write latency is a value acquired by subtracting 1 from the read latency. The read latency is a summation of the CAS latency and the additive latency. The write latency signal of the DDR2 synchronous semiconductor memory device can have a write latency value indicating one of natural numbers 1 through 10. In the embodiment of the present invention, the write latency is 1, 2 or 3 by way of example.

The address shift part 220 includes a first address shift part 230 which shifts the second address signal AT according to the write latency by receiving the first divided clock PHASEA and outputs the third address signal WL_ATA, and a second address shift part 240 which shifts the second address signal AT according to the write latency by receiving the second divided clock PHASEB and outputs the third address signal WL_ATA.

The address shift part 220 includes the two address shift parts 230 and 240. It is impossible to know whether the external write command WT is input at the rising edge of the first divided clock PHASEA or at the rising edge of the second divided clock PHASEB. Thus, the column address signal CAT is generated by shifting the latched address signal AT at the two address shift parts 230 and 240 and then latching the necessary address signal WL_ATA or WL_ATB through the write command pulses CASPWT6A and CASPWT6B at the second address latch part 250.

The second address latch part 250 outputs the column address signal CAT by latching the third address signals WL_ATA and WL_ATB by the write command pulses CASPWT6A and CASPWT6B. Herein, the write command pulses CASPWT6A and CASPWT6B are signals containing information relating to whether the external command signal WT is input at the rising edge of the first divided clock PHASEA or the second divided clock PHASEB. The write command pulses CASPWT6A and CASPWT6B can be generated through a logic combination of the write pulses WTP5A and WTP5B and the column address command pulse CASPWT6.

Herein, the write pulse WTP5A is an enable signal fed when the external write command WT is input at the rising edge of the first divided clock PHASEA. The write pulse WTP5B is an enable signal fed when the external write command WT is input at the rising edge of the second divided clock PHASEB. Since the first divided clock PHASEA and the second divided clock PHASEB are the phase-inverted signals, the write pulses WTP5A and WTP5B are the phase-inverted signals.

Figure 4:
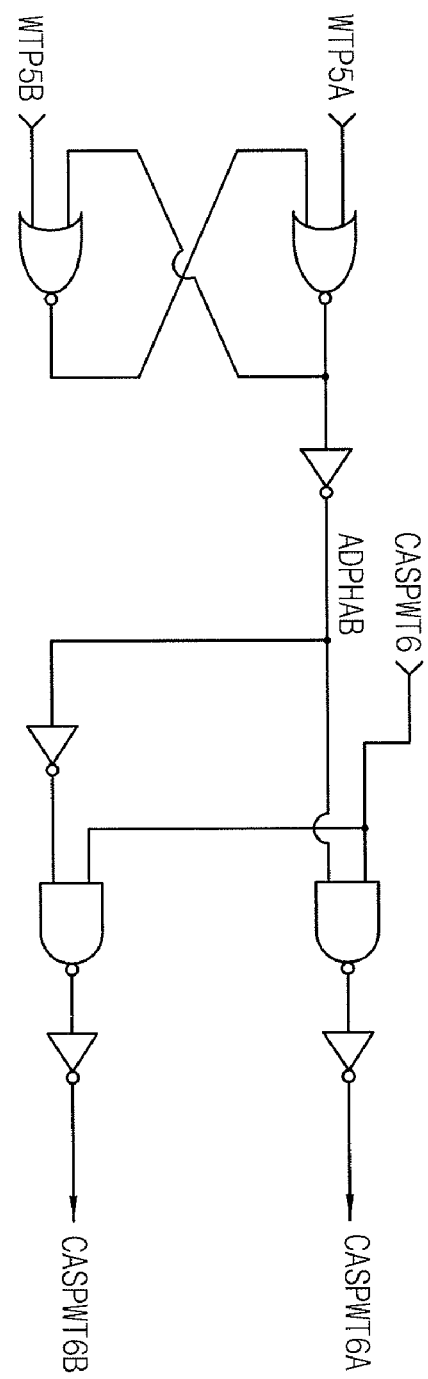
FIG. 4 is a circuit diagram for illustrating the generation of a write command pulse used as a latch signal at the second address latch part of FIG. 3.

FIG. 4 depicts a circuit which generates the write command pulses CASPWT6A and CASPWT6B used as the latch signals in the second address latch part 250. Referring to FIG. 4, when the external write command WT is input at the rising edge of the first divided clock PHASEA, the write pulse WTP5A is enabled and the write pulse WTP5B is disabled, thus enabling a write command selection signal ADPHAB. At this time, when the column command pulse CASPWT6 is enabled, the write command pulse CASPWT6A is enabled and output.

When the external write command WT is input at the rising edge of the second divided clock PHASEB, the write pulse WTP5B is enabled and the write pulse WTP5A is disabled, thus disabling the write command selection signal ADPHAB. At this time, when the column command pulse CASPWT6 is enabled, the write command pulse CASPWT6B is enabled and output.

The second address latch part 250 receives the output signals WL_ATA and WL_ATB from the first address shift part 230 and the second address shift part 240, selects as the column address signal CAT the third address signal which is latched by the enabled write command pulse of the first write command pulse CASPWT6A and the second write command pulse CASPWT6B, and then outputs the selected column address signal CAT.

Figure 5:
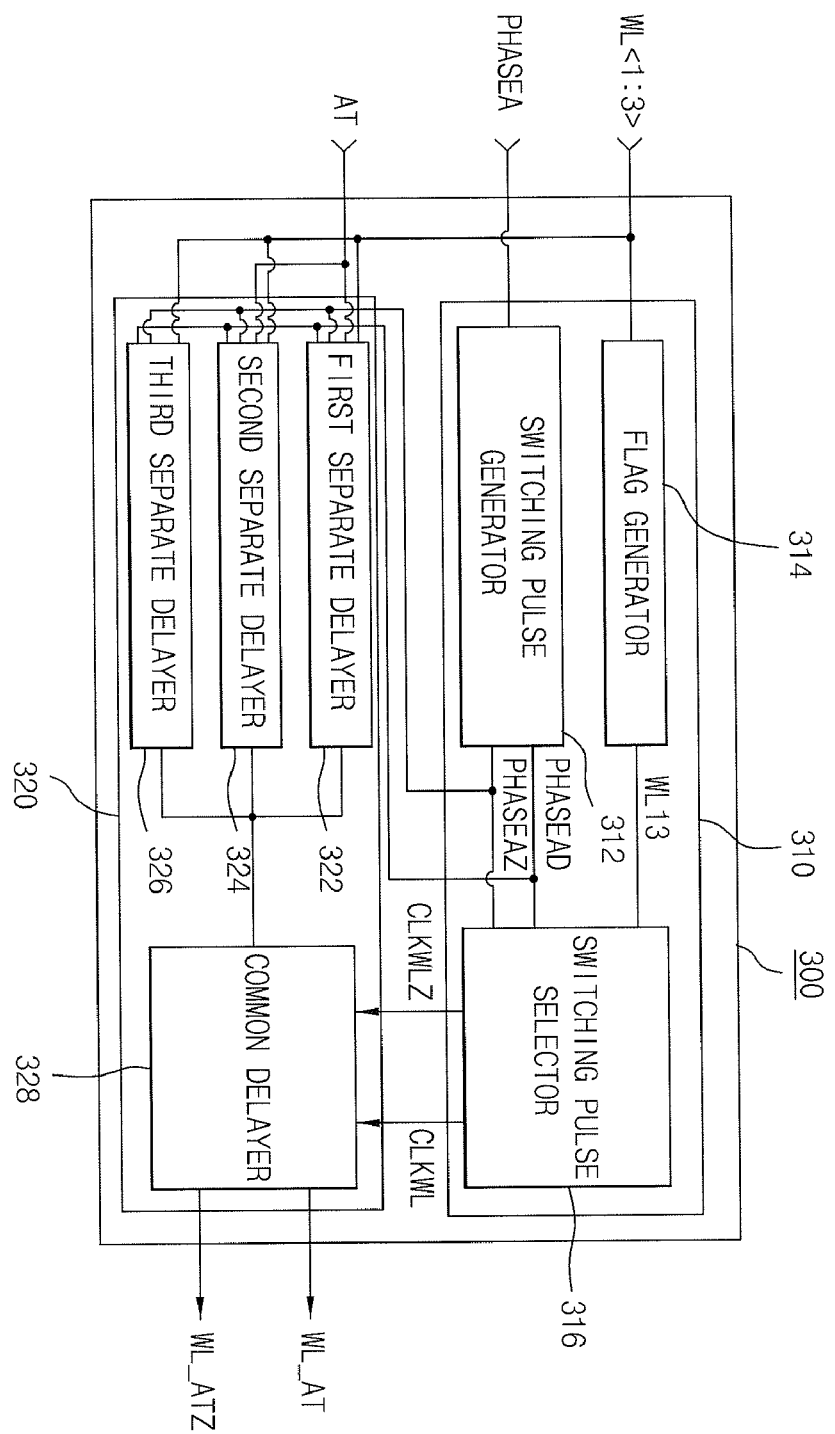
FIG. 5 is a detailed circuit diagram of an address shift part of FIG. 3.

Hereafter, the configuration of the address shift part is explained in further detail by way of example of the first address shift part of the semiconductor memory device having the write latency 1, 2 and 3. FIG. 5 is a detailed circuit diagram of the address shift part of FIG. 3. As shown in FIG. 5, the address shift part 300 includes a switching signal generator 310 and a delay means 320. A divided clock fed to the address shift part 300 is the first divided clock PHASEA.

The switching signal generator 310 generates a switching signal by receiving the divided clock PHASEA and the write latency signal WL<1:3> and outputs the switching signal to the delay means 320. Herein, the switching signal includes a first switching pulse PHASEAD, a second switching pulse PHASEAZ, a third switching pulse CLKWL, and a fourth switching pulse CLKWLZ.

The switching signal generator 310 includes a switching pulse generator 312, a flag generator 314, and a switching pulse selector 316. The switching pulse generator 312 outputs the first switching pulse PHASEAD which is delayed from the divided clock PHASEA, and the second switching pulse PHASEAZ which is phase-inverted from the divided clock PHASEA, to the delay means 320. The flag generator 314 generates and outputs a flag signal WL13 indicating whether the odd number of the write latency signals are input or not, to the switching pulse selector 316. The switching pulse selector 316 selectively outputs one of the first switching pulse PHASEAD and the second switching pulse PHASEAZ by the flag signal WL13, and outputs the fourth switching CLKWLZ by inverting the phase of the third switching pulse CLKWL.

The delay means 320 transfers and outputs the second address signal AT as the third address signals WL_ATA and WL_ATB according to the delay degree that is determined based on the switching signals PHASEAD, PHASEZ, CLKWL, and CLKWLZ, and the write latency signal WL<1:3>. The delay means 320 includes separate delayers 322, 324, and 326 corresponding to the respective write latency signals, and a common delayer 328 which outputs the third address signals WL_ATA and WL_ATB by delaying the output signals of the separate delayers 322, 324, and 326. In the embodiment of the present invention, the separate delayers include three separate delayers 322, 324, and 326 corresponding to the write latency 1, 2, and 3.

Figure 6:
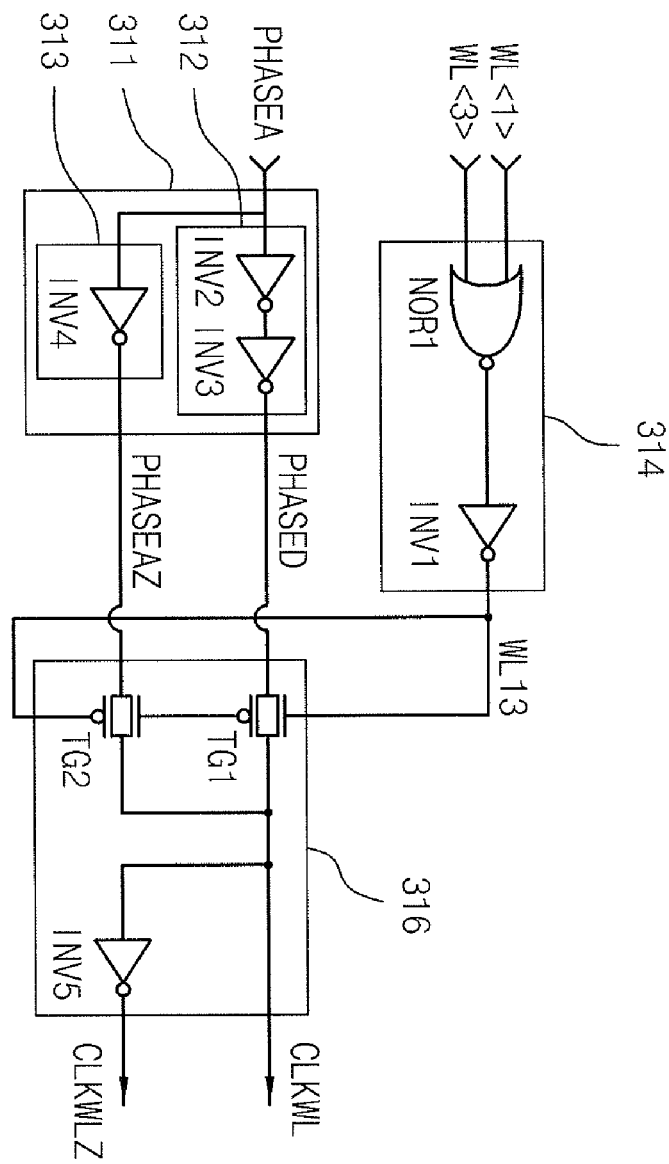
FIG. 6 is a detailed circuit diagram of a switching signal generator of FIG. 5.

Referring now to FIG. 6, the construction of the switching signal generator of FIG. 5 is described in further detail. As shown in FIG. 6, the flag generator 314 includes a NOR gate NOR1 to which the odd number of at least one write latency signal is input, and an inverter INV1 which inverts the output signal of the NOR gate and outputs the flag signal WL13.

The switching pulse generator 311 includes a first switching pulse generator 312 and a second switching pulse generator 313. The first switching pulse generator 312 includes the even number of inverters INV2 and INV3 which receive the divided clock PHASEA and output the first switching pulse PHASEAD. The second switching pulse generator 313 includes the odd number of inverters INV4 which invert the input divided clock PHASEA and output the second switching pulse PHASEAZ.

The switching pulse selector 316 includes a first switching pulse transmission gate TG1, a second switching pulse transmission gate TG2, and an inverter INV5. When the flag signal WL13 is enabled, the first switching pulse transmission gate TG1 transfers the first switching pulse PHASEAD and outputs the third switching pulse CLKWL. When the flag signal WL13 is disabled, the second switching pulse transmission gate TG2 transfers the second switching pulse PHASEAZ and outputs the third switching pulse CLKWL. The inverter INV5 inverts the phase of the third switching pulse CLKWL and outputs the fourth switching pulse CLKWLZ.

The following explanation describes the operation of the switching signal generator 310 when the write latency is 1 and the external write command WT is input at the rising edge of the first divided clock PHASEA. As the write latency is 1, the flag generator 314 outputs a HIGH flag signal WL13. The switching pulse generator 311 receives the first divided clock PHASEA and outputs the first switching pulse PHASEAD and the second switching pulse PHASEAZ. At this time, the flag signal WL13 enabled in HIGH state turns on the first switching pulse transmission gate TG1. Hence, the switching signal generator 310 outputs the third switching pulse CLKWL as the first switching pulse PHASEA, and outputs the fourth switching pulse CLKWLZ by inverting the phase of the third switching pulse CLKWL.

Figure 7:
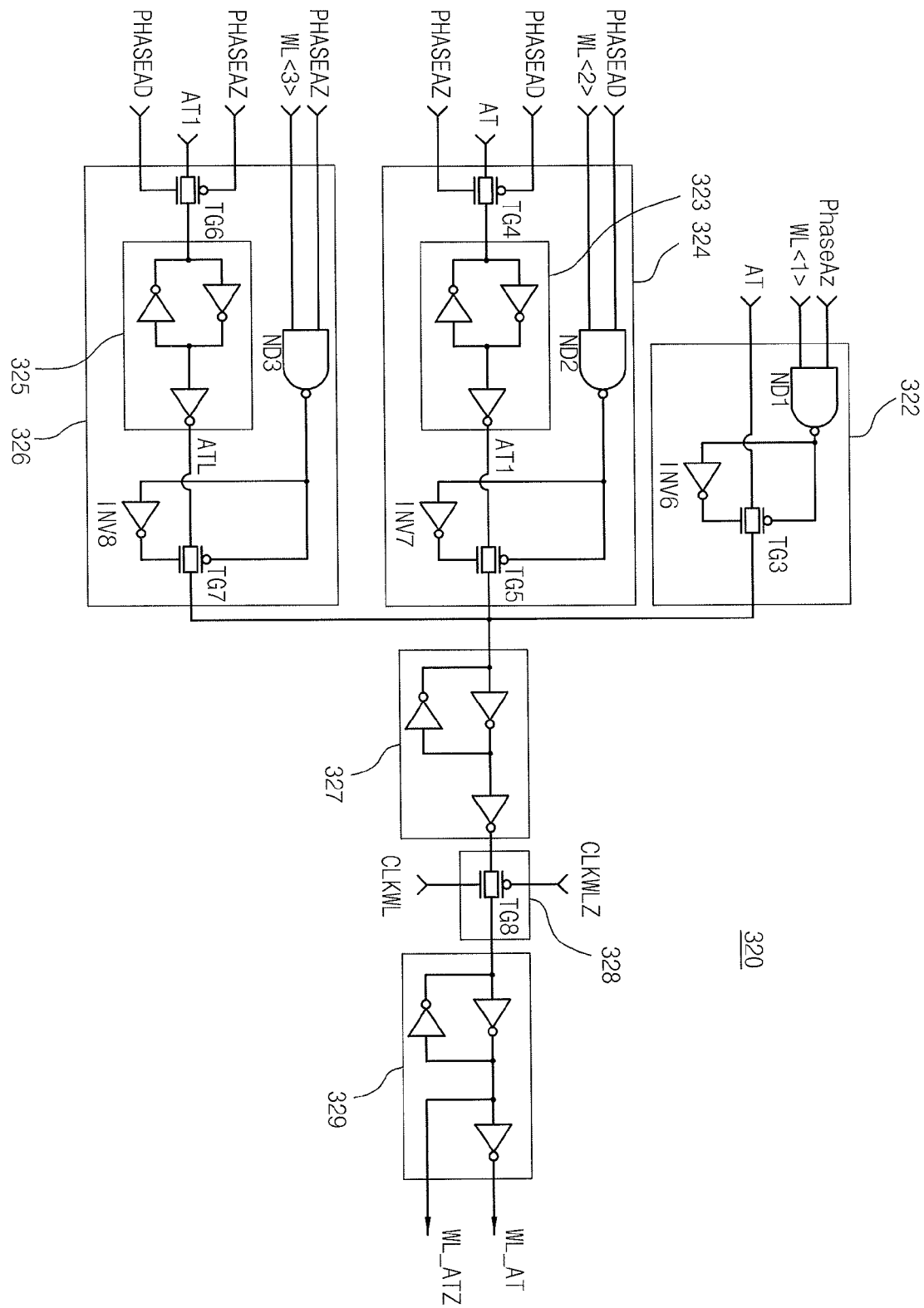
FIG. 7 is a detailed circuit diagram of a delay means of FIG. 5.

The construction of the delay means of FIG. 5 is now described in further detail by referring to FIG. 7. As shown in FIG. 7, the delay means 320 includes the first separate delayer 322, the second separate delayer 324, the third separate delayer 326, and the common delayer 328. Herein, the first separate delayer 322 corresponds to the write latency signal of 1, the second separate delayer 324 corresponds to the write latency signal of 2, and the third separate delayer 326 corresponds to the write latency signal of 3.

When the signal WL<1> of the write latency 1 is enabled, the first separate delayer 322 is switched according to the second switching pulse PHASEAZ to delay and transfer the second address signal AT to the common delayer 328. The first separate delayer 322 includes a NAND gate ND1, an inverter INV6, and a first delay gate TG3.

The NAND gate ND1 NAND-operates the input write latency signal WL<1> and the input second switching pulse PHASEAZ. The inverter INV6 inverts and outputs the phase of the output from the NAND gate ND1. The first delay gate TG3 transfers the second address signal AT to the common delayer 328 using the output of the NAND gate ND1 and the output of the inverter INV6 as the switching signals.

When the signal WL<2> of the write latency 2 is enabled, the second separate delayer 324 is switched according to the first switching pulse PHASEAD and the second switching pulse PHASEAZ to delay and transfer the second address signal AT to the common delayer 328. The second separate delayer 324 includes a NAND gate ND2, an inverter NV7, a first additional delay gate TG4, and a first delay gate TG3.

The NAND gate ND2 NAND-operates the input write latency signal WL<2> and the input first switching pulse PHASEAD. The inverter INV7 inverts and outputs the phase of the output from the NAND gate ND2. The first additional delay gate TG4 delays and outputs the second address signal AT according to the first switching pulse PHASEAD and the second switching pulse PHASEAZ. The second delay gate TG5, when the signal WL<2> of the write latency 2 is enabled, is switched according to the first switching pulse PHASEAD to delay and transfer the output signal of the first additional delay gate TG4 to the common delayer 328.

It is preferred that the second separate delayer 324 further includes a first latch part 323 which is located between the first additional delay gate TG4 and the second delay gate TG5 to latch and output the output signal of the first additional delay gate TG4 to the second delay gate TG5.

When the signal WL<3> of the write latency 3 is enabled, the third separate delayer 326 is switched according to the first switching pulse PHASEAD and the second switching pulse PHASEAZ to delay and transfer the second address signal AT to the common delayer 328. The third separate delayer 324 includes a NAND gate ND3, an inverter INV8, a second additional delay gate TG6, and a third delay gate TG7.

The NAND gate ND3 receives and NAND-operates the write latency signal WL<3> and the second switching pulse PHASEAZ. The inverter TNV8 inverts and outputs the phase of the output from the NAND gate ND3. The second additional delay gate TG6 delays and outputs the output signal AT1 of the first additional delay gate TG4 according to the first switching pulse PHASEAD and the second switching pulse PHASEAZ. The third delay gate TG7, when the signal WL<3> of the write latency 3 is enabled, is switched according to the second switching pulse PHASEAZ to delay and transfer the output signal from the second additional delay gate TG6 to the common delayer 328.

It is preferred that the third separate delayer 326 further includes a second latch part 325 which is located between the second additional delay gate TG6 and the third delay gate TG7 to latch and output the output signal of the second additional delay gate TG6 to the third delay gate TG7.

The common delayer 328 includes a transmission gate TG8 which delays the output signals of the separate delayers 322, 324, and 326 and outputs the third address signals WL_AT and WL_ATZ according to the third switching pulse CLKWL and the fourth switching pulse CLKWLZ.

It is preferred that the delay means 320 further includes a third latch part 327 which is located between the separate delayers 322, 324, and 326 and the common delayer 328 to latch and output the output signals of the separate delayers 322, 324, and 326 to the common delayer 328, and a fourth latch part 329 which latches and outputs the output signal of the common delayer 328.

Now, the operation of the delay means 320 is described when the write latency is 1 and the external write command WT is input at the rising edge of the first divided clock PHASEA. As the write latency is 1, the write latency signal WL<1> is enabled. Accordingly, the first delay gate TG3 is turned on or off according to the second switching signal PHASEAZ. If the second switching signal PHASEAZ is LOW, the second address signal AT is delayed until the second switching signal PHASEAZ transits to HIGH and thus shifted by the half cycle of the second switching signal PHASEAZ.

Next, the output signal of the first delay gate TG3 is fed to the common delayer 328. The common delayer 328 is turned on or off according to the third switching pulse CLKWL and the fourth switching pulse CLKWLZ as described in FIG. 6. If the third switching signal CLKWL is LOW and the fourth switching signal CLKWLZ is HIGH, the output signal of the first delay gate TG3 is delayed until the third switching signal CLKWL transits to LOW and the fourth switching signal CLKWLZ transits to HIGH, and thus shifted by the half cycle of the third switching signal CLKWL or the fourth switching signal CLKWLZ.

In case where the write latency is over 2 or the external write command WT is input at the rising edge of the second divided clock PHASEA, the operation of each separate delayer can be easily inferred from the operation of the first separate delayer 322 as mentioned above and thus its detailed description shall be omitted.

Meanwhile, if the write latency is over 4, the delay means 320 can further include a separate delayer (not shown) corresponding to the write latency. For instance, a separate delayer (not shown) corresponding to the even write latency signal over 4, may include an additional delay gate which receives the output signal of the additional delay gate of the separate delayer corresponding to the odd write latency signal which is smaller than the even write latency signal by 1, delays the received signal according to the first switching pulse PHASEAD and the second switching pulse PHASEAZ and then outputs the delayed signal to the delay gate.

A separate delayer (not shown) corresponding to the odd write latency signal over 5, can include an additional delay gate which receives the output signal of the additional delay gate of the separate delayer corresponding to the even write latency signal which is smaller than the odd write latency signal by 1, delays and outputs the signal to the delay gate according to the first switching pulse PHASEAD and the second switching pulse PHASEAZ.

Figure 8:
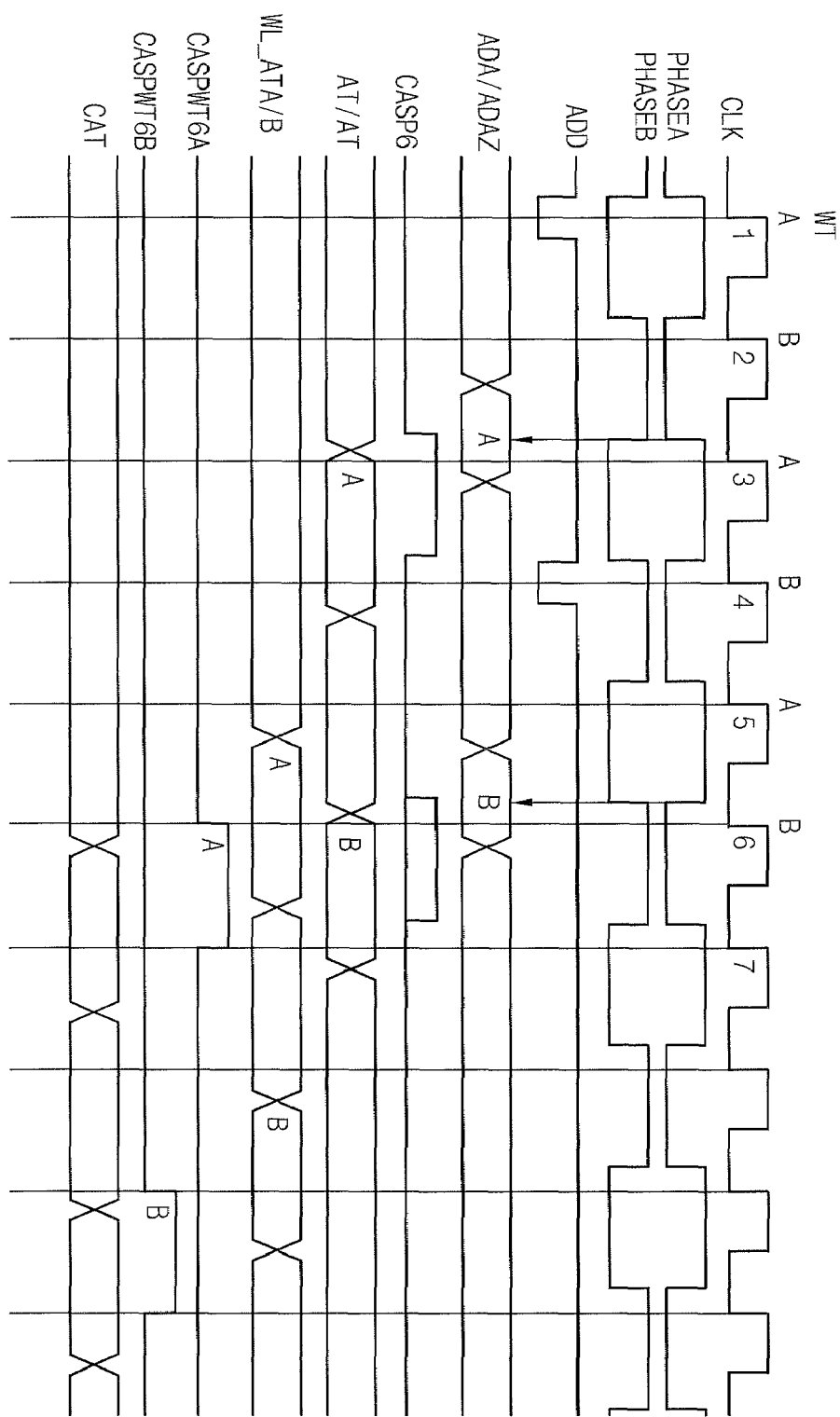
FIG. 8 is an operation timing diagram for illustrating an operation of the address latch circuit of FIG. 3.

Hereafter, the operation of the address latch circuit is described according to an embodiment of the present invention by referring to FIG. 8. FIG. 8 is an operation timing diagram of the address latch circuit according to an embodiment of the present invention when the write latency is 1 in the DDR2 synchronous memory device operating in the 4-bit prefetch.

Referring to FIG. 8, the clock buffer 40 generates the first divided clock PHASEA and the second divided clock PHASEB by receiving and 2-dividing the external clock CLK. First, descriptions provide on a case where the external write command WT is input at the first rising edge of the external clock CLK, that is, at the rising edge of the first divided clock. The external address signal ADD fed to the address input pin is output as the first address signals ADA and ADAZ of the CMOS level through the address buffer 30. Passing through the address buffer 30, the first address signals ADA and ADAZ have a certain delay. In the embodiment of the present invention, the first address signals ADA and ADAZ have the delay of about 1.5 clock based on the external clock CLK, compared to the address signal ADD.

The first address signals ADA and ADAZ output from the address buffer 30 are latched at the first latch part 210 by the column address command pulse CASP6, which is the latch signal, and then output as the second address signal AT. In the embodiment of the present invention, the second address signal AT is latched in synchrony to the third rising edge of the external clock CLK.

The second address signal AT output from the first latch part 210 is fed to the first address shift part 230 and the second address shift part 230 and shifted as much as to correspond to the respective write latencies. In the embodiment of the present invention, the second address signal AT is shifted by one cycle of the first divided clock, of which detailed explanation has been provided in FIGS. 6 and 7 and thus shall be omitted.

Still, in FIG. 8, the third address signals WL_ATA and WL_ATB are shifted by more than one cycle from the second address signal AT based on the first divided clock PHASEA. This delay occurs while passing through the elements such as gates and latches, of the first address shift part 230.

The third address signals WL_ATA and WL_ATB output from the first address shift part 230 are latched at the second latch part 250 by the write command pulse CASPWT6A and output as the column address signal CAT. In the embodiment of the present invention, the column address signal CAT is latched and output at the sixth rising edge of the external clock CLK. The write command pulse CASPWT6A is enabled as mentioned in FIG. 4. The generated column address signal CAT may be fed to a column decoder (not shown) for its decoding.

As set forth above, when the external write command WT is input, the address latch circuit according to an embodiment of the present invention generates the column address signal CAT using the clocks PHASEA and PHASEB divided from the external clock CLK.

The divided clocks PHASEA and PHASEB respectively have the multiple cycle of the external clock CLK. Hence, even in the rapid operation with the short cycle of the external clock CLK, the sufficient pulse width can be ensured for the address signal processing, thus stably generating the column address signal.

Since the divided clocks PHASEA and PHASEB respectively have the multiple cycle of the external clock CLK, the number of the shifts can be reduced, compared to a case where the column address signal is generated using the conventional external clock CLK. Specifically, when the conventional write latency is 1, the latched address signal requires the 3-clock shift based on the external clock CLK. By contrast, according to an embodiment of the present invention, 1.5-clock shift is needed based on the divided clocks PHASEA and PHASEB. Therefore, the number of the elements constituting the address shift part can be reduced.

As constructed above, the address latch circuit of the semiconductor memory device generates the column address signal at the intended time point by ensuring the sufficient pulse width for the address signal processing. Therefore, it can stably operate even when the external clock CLK of the short cycle is input for the rapid operation.

Also, since the column address signal is generated according to the time point of the external command input using the differential divided clocks, it is possible to generate the column address signal at the intended time point regardless of the time when the external command is input.

Furthermore, by reducing the number of the shifts of the address signal using the divided clocks, the circuit for shifting the address signal is simplified and advantageous in light of the rapid operation and the cost effectiveness.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An address latch circuit comprising:
a first address latch part which latches a first address signal fed from outside according to a first address latch signal and outputs a second address signal;
an address shift part which shifts the second address signal according to a divided clock, which is divided from an external clock, and a write latency signal, and outputs a third address signal; and
a second address latch part which latches the third address signal according to a second address latch signal and outputs a fourth address signal.

2. The address latch circuit of claim 1, wherein the first address latch part receives a first address latch signal that is a column address command pulse which is latched by delaying an internal command signal generated by an external command signal.

3. The address latch circuit of claim 2, wherein the address shift part receives a divided clock that includes a first divided clock and a second divided clock, each of which is obtained by dividing an external clock, each of the divided clocks having a phase, the phases of the first divided clock and the second divided clock being opposite to each other.

4. The address latch circuit of claim 3, wherein the second address latch part receives a second address latch signal that is a signal containing information relating to whether a command signal fed from the outside is input at a rising edge of the first divided clock or at a rising edge of the second divided clock.

5. The address latch circuit of claim 1, wherein the first address latch part receives a first address signal that is a differential signal fed through an external address buffer.

6. The address latch circuit of claim 1, wherein the address shift register receives a write latency signal determined by a CAS latency and an additive latency defined at an external mode register set.

7. The address latch circuit of claim 1, wherein the address shift part comprises:
a switching signal generator, which receives the divided clock and the write latency signal and generates a switching signal; and
a delay circuit, which transfers the second address signal according to a delay determined by the switching signal and the write latency signal, and which outputs the third address signal.

8. The address latch circuit of claim 7, wherein the switching signal generator comprises:
a switching pulse generator which outputs a first switching pulse having a phase, and which is delayed from the divided clock and a second switching pulse phase-inverted from the divided clock;
a flag generator, which outputs a flag signal indicating whether an even number of the write latency signals are input; and
a switching pulse selector, which selectively outputs one of the first switching pulse and the second switching pulse according to the flag signal, and outputs a fourth switching pulse by inverting the phase of the third switching pulse, and
the switching signal includes the first switching pulse, the second switching pulse, the third switching pulse, and the fourth switching pulse.

9. The address latch circuit of claim 8, wherein the switching pulse generator comprises a first switching pulse generator and a second switching pulse generator, and
the first switching pulse generator comprises:
an even number of inverters that receive the divided clock, which has a phase, the even number of inverters outputting the first switching pulse which also has a corresponding phase; and
an odd number of inverters that also receive the divided clock, the odd number of inverters outputting the second switching pulse having a phase that is opposite to the phase of the first switching pulse.

10. The address latch circuit of claim 8, wherein the flag generator comprises:
a NOR gate which receives an odd number of at least one write latency signal; and
an inverter which outputs the flag signal by inverting a phase of an output signal of the NOR gate.

11. The address latch circuit of claim 8, wherein the switching pulse selector comprises:
a first switching pulse transmission gate which transfers the first switching pulse and outputs the third switching pulse when the flag signal is enabled;
a second switching pulse transmission gate which transfers the second switching pulse and outputs the third switching pulse when the flag signal is disabled; and
an inverter which outputs the fourth switching pulse by inverting a phase of the third switching pulse.

12. The address latch circuit of claim 8, wherein the write latency signal includes a write latency signal indicating one of natural numbers 1 through 10.

13. The address latch circuit of claim 12, wherein the delay circuit comprises:
separate delayers which correspond to the respective write latency signals; and
a common delayer which delays and outputs an output signal of the separate delayer.

14. The address latch circuit of claim 13, wherein a first separate delayer of the separate delayers, corresponding to the write latency signal of 1 comprises:
a first delay gate which is switched according to the second switching pulse to delay and transfer the second address signal to the common delayer when the write latency signal of 1 is enabled.

15. The address latch circuit of claim 14, wherein a second separate delayer of the separate delayers, corresponding to the write latency signal of 2 comprises:
a first additional delay gate which delays and outputs the second address signal according to the first switching pulse and the second switching pulse; and
a second delay gate which is switched according to the first switching pulse to delay and transfer an output signal of the first additional delay gate to the common delayer when the write latency signal of 2 is enabled.

16. The address latch circuit of claim 15, wherein the delay circuit comprises:
a first latch part which is located between the first additional delay gate and the second delay gate to latch and output the output signal of the first additional delay gate to the second delay gate.

17. The address latch circuit of claim 15, wherein a third separate delayer of the separate delayers, corresponding to the write latency signal of 3 comprises:
a second additional delay gate which receives and delays an output signal of the first additional delay gate of the second separate delayer according to the first switching pulse and the second switching pulse, and outputs the delayed signal to the first delay gate; and
a third delay gate which is switched according to the second switching pulse to delay and output an output signal of the second additional delay gate to the common delayer when the write latency signal of 3 is enabled.

18. The address latch circuit of claim 17, wherein the delay means comprises:
a second latch part which is located between the second additional delay gate and the first delay gate to latch and output an output signal of the second additional delay gate to the first delay gate.

19. The address latch circuit of claim 17, wherein a separate delayer of the separate delayers, corresponding to an even write latency signal above 4 comprises:
a third additional delay gate which receives an output signal of an additional delay gate of a separate delayer corresponding to an odd write latency signal which is smaller than the even write latency signal by 1, delays and outputs the received signal according to the first switching pulse and the second switching pulse; and
a fourth delay gate which is switched according to the first switching pulse when the even write latency signal above 4 is enabled, delays and transfers an output signal of the third additional delay gate to the common delayer.

20. The address latch circuit of claim 19, wherein a separate delayer of the separate delayers, corresponding to an odd write latency signal above 5 comprises:
a fourth additional delay gate which receive an output signal of an additional delay gate of a separate delayer corresponding to an even write latency signal which is smaller than the odd write latency signal by 1, delays and outputs the received signal according to the first switching pulse and the second switching pulse; and
a fifth delay gate which is switched according to the second switching pulse when the odd write latency signal above 5 is enabled, delays and transfers an output signal of the fourth additional delay gate to the common delayer.

21. The address latch circuit of claim 13, wherein the common delayer comprises:
a transmission gate which delays an output signal of the separate delayer according to the third switching pulse and the fourth switching pulse, and outputs a third address signal.

22. The address latch circuit of claim 13, wherein the delay circuit further comprises:
a third latch part which is located between the separate delayer and the common delayer to latch and output an output signal of the separate delayer to the common delayer.

23. The address latch circuit of claim 13, wherein the delay circuit further comprises:
a fourth latch part which latches and outputs an output signal of the common delayer.

24. The address latch circuit of claim 4, wherein the address shift part comprises:
a first address shift part which receives the first divided clock, shifts the second address signal according to the write latency, and outputs a third address signal; and
a second address shift part which receives the second divided clock, shifts the second address signal according to the write latency, and outputs the third address signal.

25. The address latch circuit of claim 24, wherein the second address latch signal comprises:
a first write command signal which is enabled when a command signal fed from outside is input at an rising edge of the first divided clock; and
a second write command signal which is enabled when a command signal fed from outside is input at a rising edge of the second divided clock.

26. The address latch circuit of claim 25, wherein the second address latch part receives output signals from the first address shift part and the second address shift part, and selectively outputs the third address signal, which is latched according to an enabled write command pulse of the first write command pulse and the second write command pulse, as a fourth address signal.

* * * * *